United States Patent
Schödlbauer

[11] Patent Number: 6,018,318
[45] Date of Patent: Jan. 25, 2000

[54] METHOD AND APPARATUS FOR DETERMINING THE PHASE ANGLE IN POSITION TRANSMITTERS WITH SINUSOIDAL OUTPUT SIGNALS

[75] Inventor: Dieter Schödlbauer, München, Germany

[73] Assignee: Ruf Electronics GmbH, Hohenkirchen, Germany

[21] Appl. No.: 09/182,694

[22] Filed: Oct. 29, 1998

[30] Foreign Application Priority Data

Oct. 29, 1997 [DE] Germany .......................... 197 47 753

[51] Int. Cl.[7] .............................. G01J 5/04; G01R 13/02; G01B 7/30
[52] U.S. Cl. ........................... 342/442; 324/76.82; 702/72
[58] Field of Search ............................. 342/442; 702/72; 324/76.82, 86

[56] References Cited

U.S. PATENT DOCUMENTS 4,506,333  3/1985  Porrot et al. ............................. 702/72

FOREIGN PATENT DOCUMENTS 195 39 134  10/1995  Germany .......................... G01B 7/00
195 48 385  12/1995  Germany .......................... G01B 7/30

*Primary Examiner*—Gregory C. Issing
*Attorney, Agent, or Firm*—Senniger, Powers, Leavitt & Roedel

[57] ABSTRACT

The method and apparatus for determining the phase angle in position transmitters with sinusoidal output signals utilizes a sensor that generates a sinusoidal signal $U_0(\alpha)=A \sin \alpha$ and a cosinusoidal signal $U_1(\alpha)=A \cos \alpha$. Linear combinations $U_2=U_0+U_1$ and $U_3=U_1-U_0$ are formed, and the quadrant is determined in a cyclic binary code $q_1$ $q_0$ by examining the preceding signs of these signals. Depending on the quadrant, a division $U_2/U_1$ or $U_2/U_0$ is carried out. The result of this division serves as the address for inquiring a stored angle table. Initially, the analog track signals $U_0$, $U_1$ are converted into digital signals, and all additional calculations are carried out in purely digital fashion. During the integral division, the dividend is one of the linear combinations ($U_2$), and the divisor is, depending on the determined quadrant, either the sinusoidal or the cosinusoidal track signal. In this case, the amount of the divisor always lies within the range above $\sqrt{2}/2$ of the maximum value of the respective track signal.

21 Claims, 5 Drawing Sheets

METHOD AND APPARATUS FOR DETERMINING THE PHASE ANGLE IN POSITION TRANSMITTERS WITH SINUSOIDAL OUTPUT SIGNALS

The invention pertains to a method and apparatus for determining the phase angle in position transmitters with sinusoidal output signals.

A method of this type is known from DE 19,539,134 A1. In this case, a sensor generates a sinusoidal and cosinusoidal electric output signal in dependence on the relative rotational position or the relative position of the position transmitter. For example, one or more tracks of magnetized increments may be arranged on an object, the rotational position or position of which needs to be determined. A sensor, in this case a magnetic sensor, is arranged opposite to the aforementioned tracks. The linear combinations sine ($\alpha$)+cosine ($\alpha$) and sine ($\alpha$)–cosine ($\alpha$)

are formed of these sinusoidal and cosinusoidal signals, wherein the resulting signals are also a sinusoidal and a cosinusoidal signal which, however, are phase-shifted relative to the basic signals by 45°, and wherein the amplitude of the resulting signals represents $\sqrt{2}$-times the basic signal. The respective quadrant is determined by examining the preceding signs of the sinusoidal and cosinusoidal signals. Depending on this quadrant, either the arc tangent function or the arc cotangent function is formed in order to determine the position value ($\alpha$). The formation of the tangent and cotangent function is realized by means of a successive approximation of two analog voltage values. In this case, the central calculation is a multiplication with an analog/digital converter. In the mathematical sense, a number that depends on the phase angle $\alpha$ and lies between 0 and 1 is mapped on the values of the A/D converter, wherein the desired phase angle or position value $\alpha$ can be determined via an angle table with the aid of this number.

One disadvantage of this successive approximation method is that the scanned analog signals need to be available over the entire duration of the approximation, and that said analog signals need to remain constant during this duration. However, this requires a high expenditure with respect to the stability of the analog components. This is relatively problematic, in particular, with respect to temperature errors.

Another problem of this known method can be seen in the fact that the output signals of the sensor become weaker over the service life of the position transmitter. This is, for example, caused by the magnetization of the scanned tracks becoming weaker such that the amplitude of the scanned signals drops. Theoretically, an amplitude error is canceled out due to the quotient formation in the tangent or cotangent function. However, practical experience has demonstrated that the scanned signals become so weak that a reliable determination of the phase angle or the position value $\alpha$ is no longer possible. In the previously described method, such an error can practically not be detected unless no measured value is output at all.

DE 19,548,385 A1 describes a method for determining the phase angle in position transmitters with sinusoidal output signals, wherein the output signals are converted in analog/digital converters and all calculations are carried out in purely digital fashion.

The invention is based on the objective of additionally developing the initially described method in such a way that highly accurate measuring results which remain stable over a long period of time can be obtained with a reduced expenditure regarding electronic components, wherein said method also provides a self-diagnostic option for evaluating the quality of the measured values.

This objective, along with other advantageous embodiments and additional developments of the invention, is attained with the characteristics set forth in the claims.

A first important aspect of the invention is that the analog output signals of the sensor are fed to scan and hold circuits, where they are intermediately stored in clocked fashion. These signals are converted into digital values immediately thereafter by means of one respective analog/digital converter. These digital values are stored and are available as "constant" values for the additional calculations, namely independently of the fact whether the scan and hold circuits hold the stored analog values stable or not. The entire additional signal processing takes place exclusively in digital fashion.

Another important aspect of the invention is that the determination of the respective quadrant, in which the sensor signals are situated, takes place in a cyclic code such that instabilities at the quadrant boundaries are prevented.

Another important aspect of the invention is that—in contrast to the state of the art—an approximative multiplication is no longer carried out. The invention proposes an effective integral division such that the cycle times remain relatively short. When carrying out this division, the invention proposes that the divisor is selected from only certain sections of the scanned track signals, namely from sections in which the track signal that is standardized to 1 lies between approximately 0.7 and 1. Consequently, a division by very small numeric values is eliminated, i.e., the accuracy of the calculation is increased. In addition, a self-diagnostic option is made possible due to the fact that the absolute value of the divisor can only fluctuate within relatively narrow limits if the measuring arrangement operates flawlessly.

According to one advantageous additional development of the invention, this is realized due to the fact that the absolute value of the divisor is compared with a predetermined fixed threshold value. If the absolute value of the divisor lies below this predetermined threshold value, it is possible to evaluate the quality of the measuring result and, for example, predict a future failure of the measuring arrangement.

According to one additional development of the invention, the output measured value is inevitably set on the quadrant boundary if the track signal lies in the vicinity of a quadrant boundary and the preceding sign (signum function) of the divisor and the dividend differ from one another, which indicates erroneous track signals. Consequently, very accurate measuring results are also obtained within the critical range of the quadrant boundaries, and no inquiry of the angle table takes place.

The method according to the invention operates in principle in such a way that the respective phase angle or position value $\alpha$ is determined in the form of an "offset" value referred to the preceding quadrant boundary. In this case, the range of values of the angle table lies between 0° and 90°. However, it is also possible to determine the phase angle or position value $\alpha$ in the form of the offset or distance from the nearest quadrant boundary, i.e., the range of values of the angle table can be cut in half to a range between 0° and 45°.

It should also be mentioned that the method according to the invention is not dependent on the primary source of the track signals, i.e., it is not limited to magnetically generated track signals.

The invention is described in detail below with reference to one embodiment that is illustrated in the figures. The figures show:

FIG. 1, the progression of the track signals as well as other calculated signals in dependence on the phase angle or position value $\alpha$;

FIG. 2, a diagram similar to FIG. 1 which shows the progression of the dividend and the divisor during the quotient formation with value thresholds for diagnostic purposes;

FIG. 3, a diagram of a calculated position value;

FIG. 4, an angle table for a quadrant; and

FIG. 5, a block diagram with a flow chart for explaining the method according to the invention.

Equations and abbreviations used:

| | |
|---|---|
| $\alpha$ | phase angle $0 \leq \alpha \leq 2\pi$ |
| $U_i$ | signal voltage value with indices $0 \leq i \leq 3$ |
| A | amplitude of the track signals |
| $\Phi(x)$ | saltus function |
| | $\Phi(x) = 0$ for $x \leq 0$ |
| | $\Phi(x) = 1$ for $x > 0$ |
| $q_0, q_1$ | LSB and MSB of the quadrant |
| $q(\alpha)$ | number of the quadrant within one signal period, $0 \leq q \leq 3$ |
| address($\alpha$) | trigonometric function which changes depending on the quadrant with the bit width of the A/D converter; serves for addressing the angle table via a quadrant, in binary notation with bits $z_n$, $0 \leq n \leq$ bit width(A/D)$-1$ |
| date($\alpha$) | the date that belongs to an address of the angle table |
| $D_n(\alpha)$ | data bit n of the date, $0 \leq n \leq$ bit width(A/D)$-1$ |
| $\Phi(\alpha)$ | calculated position value (end result); $0 \leq \Phi(\alpha) \leq 2^{\text{bit width(A/D)}+z} - 1$ |

FIG. 1 shows the progression of the sinusoidal and cosinusoidal track signals in dependence on the position value $\alpha$, i.e.,

| | | |
|---|---|---|
| $U_0(\alpha) = A * \sin(\alpha)$ | track signal "sine" | (1) |
| $U_1(\alpha) = A * \cos(\alpha)$ | track signal "cosine" | (2) |

Due to the analog/digital conversion, these measured values may initially have a (positive) offset on the order of half the reference voltage. After a corresponding subtraction, the desired input values with the corresponding preceding signs are formed, wherein 1 bit of the resolution is lost as the preceding sign bit. The linear combinations $$U_2(\alpha) = U_1(\alpha) + U_0(\alpha) = A(\cos(\alpha) + \sin(\alpha)) \quad (3)$$

$$U_3(\alpha) = U_1(\alpha) - U_0(\alpha) = A(\cos(\alpha) - \sin(\alpha)) \quad (4)$$

which are additionally required during the course of the evaluation are formed from these track signals by means of addition or subtraction, respectively. The curves of these linear combinations also progress in sinusoidal fashion with a phase shift of $+45°$ and an amplitude that represents $\sqrt{2}$-times the amplitude of the track signals.

The saltus functions $$q_0(\alpha) = \Phi[U_2(\alpha)] \quad (5)$$

$$q_1(\alpha) = \Phi[U_3(\alpha)] \quad (6)$$

$$q(\alpha) = q_0(\alpha) + 2 * q_1(\alpha) \quad (7)$$

are then formed from these linear combinations, wherein said saltus functions mathematically represent the signum function, i.e., the preceding sign. These saltus functions are respectively realized by checking for "0" with:

$$U_2(\alpha) > 0 \Rightarrow q_0(\alpha) = 1$$

$$U_2(\alpha) \leq 0 \Rightarrow q_0(\alpha) = 0$$

$$U_3(\alpha) > 0 \Rightarrow q_1(\alpha) = 1$$

$$U_3(\alpha) \leq 0 \Rightarrow q_1(\alpha) = 0$$

This results in a cyclic 2-bit code $q_1$, $q_2$ for the sequence of the quadrants. This code is cyclic similar to the Gray code, i.e., only 1 bit changes when changing to the next quadrant value. However, this code q is not yet present in the desired monotonic form. In a decimal notation, this code is illustrated in the form of 1, 0, 2, 3 etc. instead of 0, 1, 2, 3, etc.

During the conversion into the final "true" binary pattern $q_1$, $q_0$, the following function table applies for $q_0$:

| | | $q_1$ | |
|---|---|---|---|
| | | 0 | 1 |
| $q_0$ | 0 | 1 | 0 |
| | 1 | 0 | 1 | i.e., $q_0 = \overline{q_0} \text{ EXOR } q_1$

No conversion is required for $q_1$. In this respect, the following applies:

| | | $q_1$ | |
|---|---|---|---|
| | | 0 | 1 |
| $q_0$ | 0 | 0 | 1 |
| | 1 | 0 | 1 | i.e., $q_1 = q_1$.

The result of this conversion is illustrated in FIG. 1 in the form of a bold continuous line $q_1$ The subsequent quotient formation for addressing an angle table is carried out with $$\text{dividend}(\alpha) = U_2(\alpha) \quad (8)$$

and, depending on the quadrant, with a different divisor, namely $$\text{divisor}(\alpha) = U_0(\alpha) \text{ if } q_0(\alpha) = 0 \quad (9a)$$

$$\text{divisor}(\alpha) = U_1(\alpha) \text{ if } q_0(\alpha) = 1 \quad (9b)$$

The correlation between the quadrants 0–3, the phase or position angle $\alpha$ and the quotient $f(\alpha)$ results from the following table:

| Quadrant No. | Phase angle $\alpha$ | Quotient $f(\alpha)$ | Range of Values of $f(\alpha)$ |
|---|---|---|---|
| 0 | $45° \leq \alpha < 135°$ | $\cot(\alpha) + 1$ | $2 \geq f(\alpha) > 0$ |
| 1 | $135° \leq \alpha < 225°$ | $\tan(\alpha) + 1$ | $0 \leq f(\alpha) < 2$ |

-continued

| Quadrant No. | Phase angle α | Quotient f(α) | Range of Values of f(α) |
|---|---|---|---|
| 2 | $225° \leq \alpha < 315°$ | $\cot(\alpha) + 1$ | $2 \geq f(\alpha) > 0$ |
| 3 | $315 \leq \alpha < 45°$ | $\tan(\alpha) + 1$ | $0 \leq f(\alpha) < 2$ |

This means that the dividend is always the linear combination of U2 which is illustrated in FIG. 2 and obtained from the sum of both track signals. However, the divisor alternately represents the sinusoidal or cosinusoidal signal U1 or U0. The corresponding sections of these track signals which form the divisor are illustrated in FIG. 1 with bolder continuous lines. This indicates that the range of values of the track signals that are standardized to 1 can only lie between sine $(45°) \approx 0.71$ and 1. FIG. 2 also shows in detail that this makes it possible to define one or more threshold values for the amount of the divisor signal for diagnostic purposes. Within one quadrant, the amount of the divisor changes by no more than $-(\sqrt{2}-1)/\sqrt{2} \approx -29\%$ of the amplitude. The signal amplitudes can be monitored in this fashion without complicated and time-consuming numerics. The amount is simply obtained by masking the preceding sign bit. For example, the first threshold 1 shown in FIG. 2 may serve as the upper warning limit, wherein a signal level below the threshold 2 can be recognized as a system failure. It can be determined even more accurately if the amplitude of the track signals is already close to a system failure by providing additional threshold values, not shown.

FIGS. 1 and 2 also show that the dividend and the divisor always need to have the same preceding sign if the system functions flawlessly. Naturally, this requires that the phase position of all signals is correct and that no undesirable offset voltages occur. However, practical experience has demonstrated that one signal may already have changed its preceding sign while the other signal has not yet changed its preceding sign at quadrant boundaries. In this case, it is determined that the position value α lies on the quadrant boundary independently of the value of the dividend and the divisor. When addressing the angle table, the following applies:

$$\text{address}(\alpha) = 0 \text{ if sign(divident)} \neq \text{sign(divisor)} \quad (10a)$$

wherein the following applies otherwise:

$$\text{Address}(\alpha) = 2^{(Bit\,width(A/D)-1)} \cdot \frac{\text{dividend}(\alpha)}{\text{divisor}(\alpha)} \quad (10b)$$

if sign(dividend) = sign(divisor).

The calculation of the address for the angle table according to the aforementioned equation takes place by successively determining the address bits $z_n$ with the aid of the following equation:

$$\sum_{n=0}^{Bit\,width(A/D)-1} z_n(\alpha) \cdot (\text{divisor}(\alpha) \cdot 2^n) = \text{dividend}(\alpha) \cdot 2^{Bit\,width(A/D)-1} \quad (11)$$

wherein the calculation $*2^i$ is executed by shifting the value dividend(α) within a shift register toward the left by i digits.

Consequently, an address for reading out the position value date(α) from an angle table is defined. Rounded to integral numbers, the content of this angle table is:

$$\text{date}(\alpha) = 2^{Bit\,width(A/D)} \cdot \quad (12)$$

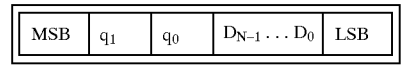

In the first and third quadrants ($q_0=0$), the read out date is replaced with its ones compliment.

$$\text{date}(\alpha) = \overline{\text{date}(\alpha)} \text{ if } q_0(\alpha) = 0 \quad (13a)$$

$$\text{date}(\alpha) = \text{date}(\alpha) \text{ if } q_0(\alpha) = 1 \quad (13b)$$

One obtains as the end result:

$$\Phi(\alpha) = \text{Date}(\alpha) + q_0(\alpha) \cdot 2^{Bit\,width(A/D)} + q_1(\alpha) \cdot 2^{Bit\,width(A/D)+1} \quad (14)$$

i.e., the result is expressed in the form

MSB $q_1$, $q_0$, $D_{N-1} \ldots D_0$  LSB

| MSB | $q_1$ | $q_0$ | $D_{N-1} \ldots D_0$ | LSB |
|---|---|---|---|---|

$D_{N-1}$ through $D_0$: fine resolution within the quadrant $q_1 q_0$ with N bits
$q_1 q_0$: number of the quadrant, wherein MSB is the "most significant bit," i.e., the bit with the highest significance, and LSB is the "lowest significant bit," i.e., the bit with the least significance.

The output format also indicates that the two most significant bits $q_1$ and $q_0$ define the respective quadrant, and that the values obtained from the angle table merely define the fine resolution within the quadrant or the offset referred to the preceding quadrant boundary.

Figure 3:
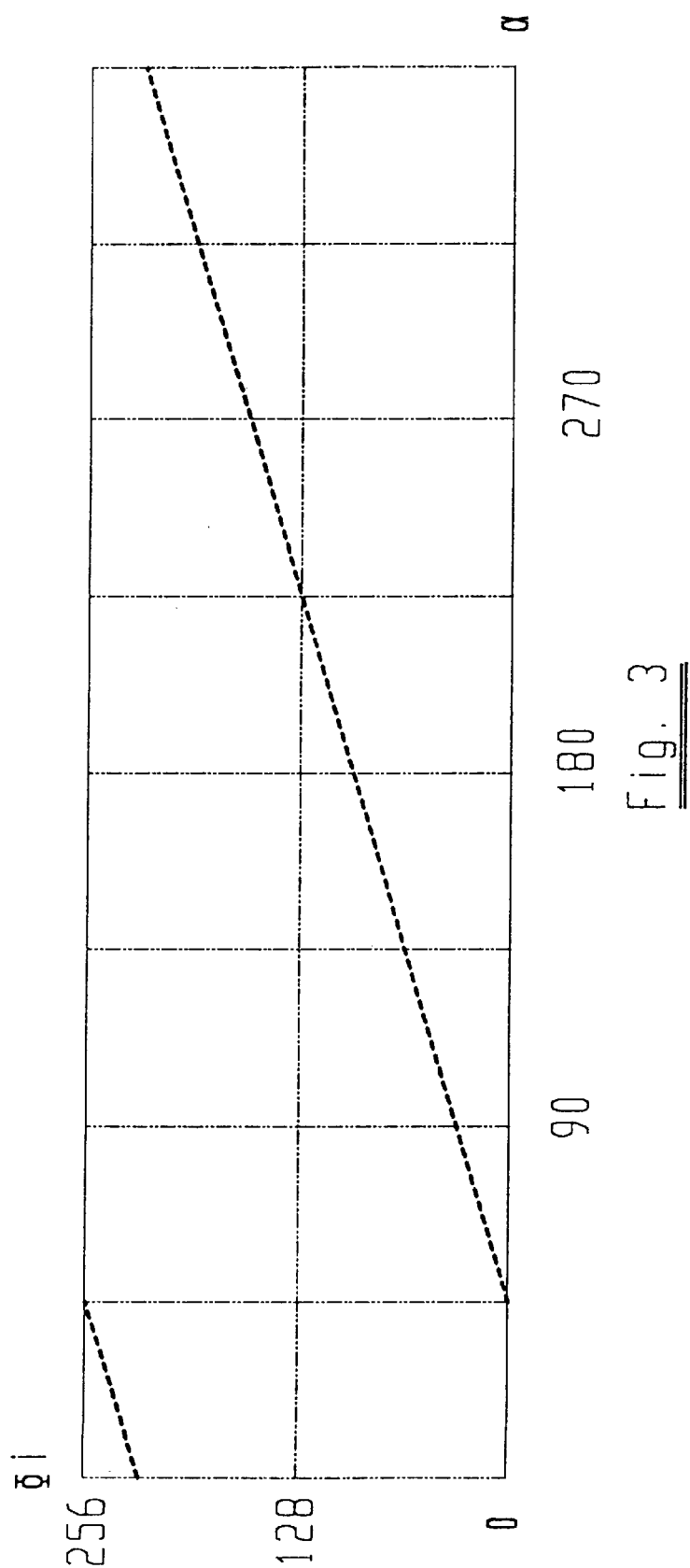
FIG. 3 shows the progression of the calculated position value at a resolution of 8 bits.
Figure 4:
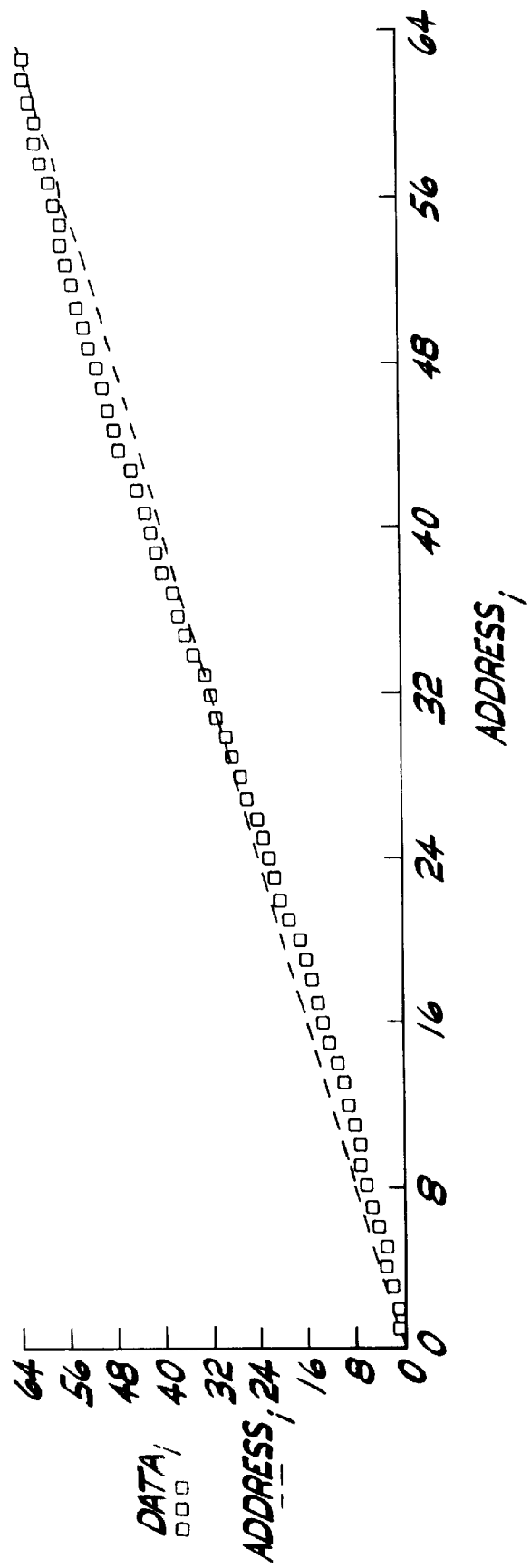

FIG. 4 shows an example of an angle table for a quadrant with a resolution of 6 bits. The two additional bits required for the calculated position value according to FIG. 3 are the bits $q_1$ and $q_0$ which define the respective quadrant. Consequently, the angle table only needs to contain values for one quadrant. The utilization of an angle table provides the advantage that it is significantly faster than the calculation of the arc tangent function or the arc cotangent function. In the embodiment shown, the angle table has the width of one full quadrant, i.e., 90°. However, it would also be possible for the angle table to have a width of only 45°, in which case it defines the value to the nearest quadrant boundary instead of the value to the preceding quadrant boundary.

Figure 5:
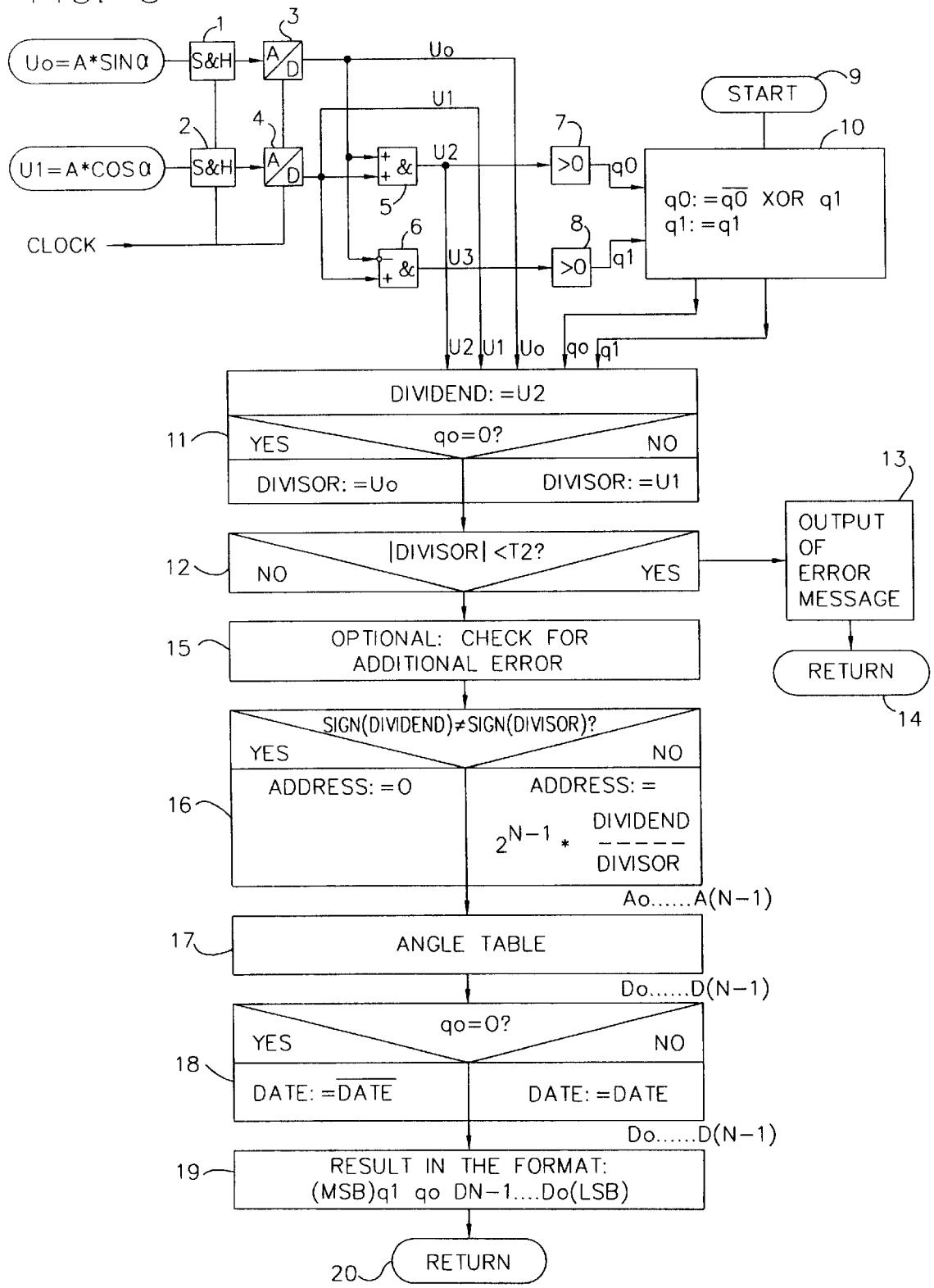

FIG. 5 shows a block diagram with a flow chart for carrying out the method according to the invention. The input signals $U_0$ and $U_1$ are generated by not shown sensors (e.g., magnetic field sensors). The two signals $U_0$ and $U_1$ are fed to one respective scan and hold circuits 1 and 2 in clocked fashion and intermediately stored. Immediately thereafter, these signals are converted into digital signals in one respective analog/digital converter 3 or 4 and stored in the form of digital signals. The A/D conversion takes place very rapidly, i.e., the scan and hold circuits 1 and 2 do not need to have a long-term stability. The entire additional processing is carried out in purely digital fashion. An adding device 5 and a subtracting device 6 which form the linear combinations $U_2=U_0+U_1$ or $U_3=U_1-U_0$, respectively, are connected to the two A/D converters 3 and 4. It is examined if the signal $U_2$ or $U_3$, respectively, is greater than 0 such that the signals $q_0$ and $q_1$ for determining the quadrant are formed in accordance with equations (5) and (6).

Figure 1:
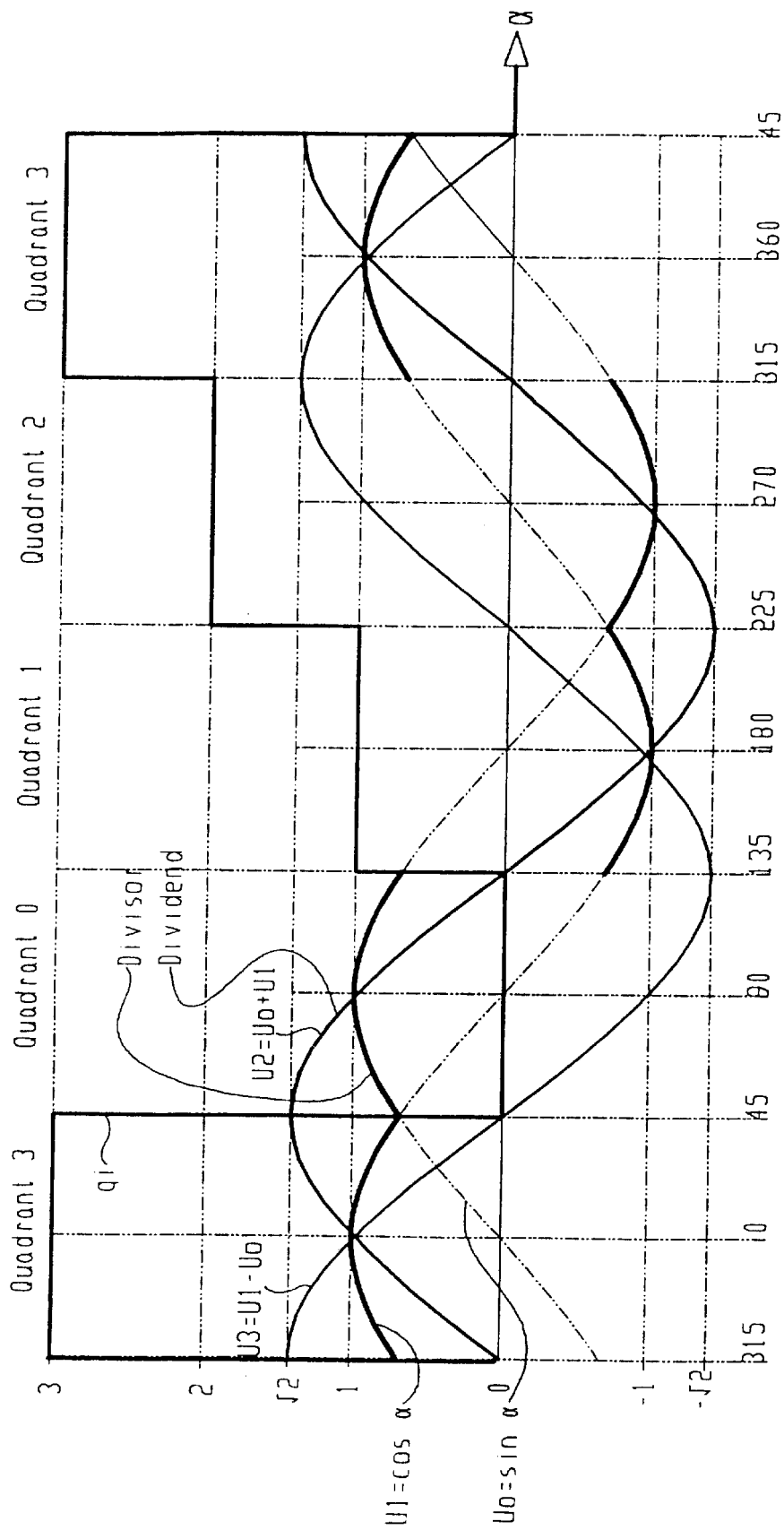

The actual method then starts with a start signal 9. The conversion of the signal $q_0$ is carried out in block 10 so as to obtain the desired monotonic form of the cyclic code for the binary pattern $q_1\ q_2$ which is also shown in FIG. 1. The division is prepared in block 11 which receives the signals $U_0$, $U_1$, $U_2$, $q_0$ and $q_1$. For this purpose, it is examined whether $q_0$ is equal to 0 or not equal to 0. If $q_0$ is equal to 0, the track signal $U_0$ is selected as the divisor. If $q_0$ is not equal to 0, the divisor is $U_1$. In both instances, the dividend is the function $U_2$.

It is then examined whether the divisor is greater or less than the threshold 2 (FIG. 2) in block 12. If the divisor is less than the threshold 2, the track signals $U_0$ and/or $U_1$ are not sufficiently high, and an error message is output in block 13, whereafter the additional calculations are terminated in block 14. This means that a self-diagnosis can be carried out with a simple threshold check. Additional errors can be determined in an optional block 15, e.g., if other threshold values have or have not been reached as was the case with threshold 1.

Figure 2:
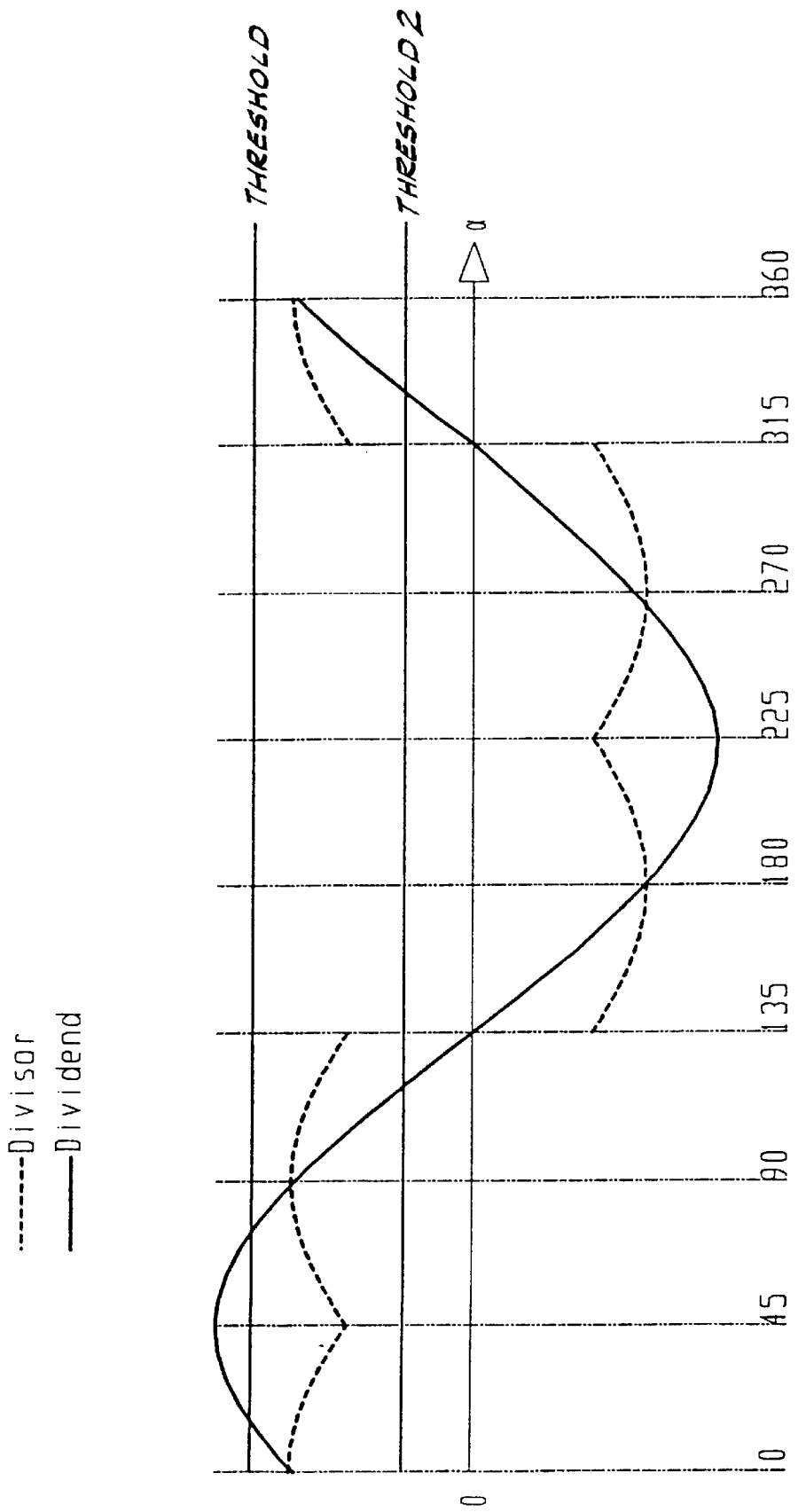
FIG. 2 shows the progression of the divisor and the dividend as well as the two thresholds 1 and 2 which allow a self-diagnosis.

In one additional block 16, it is then examined whether the preceding signs of the dividend and the divisor are identical or not. FIG. 2 shows that the divisor and the dividend need to have the same preceding sign if exact signals are received. The divisor and the dividend change their preceding sign at the boundaries between quadrant 0 and quadrant 1 and at the boundary between quadrant 2 and quadrant 3. In this case, one of the two functions may already have changed its preceding sign due to a slight phase or zero point offset, wherein the other function has not yet changed its preceding sign. Depending on the position of the threshold check 7 and 8, this was not yet recognized as a quadrant change. Consequently, it is proposed that the address for reading out an angle table 17 is set to 0 if the preceding signs of the dividend and the divisor are not identical, i.e., the address is set to the corresponding quadrant change without carrying out the division. If the preceding signs of the dividend and the divisor are identical, the division is carried out according to the previously described equation for the value address($\alpha$) in block 16, namely in the form of an integral division. This value or the address 0, respectively, then represents the input value for an angle table 17, in which an angle value $D_0 \ldots D_{(N-1)}$ is stored depending on the address ($\alpha$).

Since the angle table only contains values of one quadrant, the value read out of the angle table is, if so required, additionally transformed in block 18 depending on the signal $q_0$. If $q_0$ is equal to 0, the ones complement of the date read out of the angle table is selected. Otherwise, no changes are made. The value of the quadrant with the bits $q_1$ and $q_0$ is placed in front of the read out date in one additional block 19, and the result is output in the indicated format (MSB) $q_1\ q_0\ D_{(N-1)} \ldots D_0$ (LSB). In block 20, the system returns to the starting position and a new cycle can begin.

Naturally, all calculations or logical operations illustrated in components 5–8 and blocks 9–20 may be carried out by a programmed processor which merely receives the digitized track signals from the A/D converters 3 and 4.

What is claimed is:

1. A method for determining the phase angle in position transmitters with sinusoidal output signals, wherein a sensor generates the sinusoidal output signal $U_0(\alpha)=A^*\sin \alpha$ and a cosinusoidal output signal $U_1(\alpha)=A^*\cos \alpha$ depending on the position or rotational position a with A being the output signal amplitude, wherein linear combinations $U_2=U_0+U_1$ and $U_3=U_1-U_0$ are formed from the output signals, wherein it is determined in which quadrant the position value $\alpha$ lies by examining the preceding signs of the output signals, wherein a division for forming a tangent function or a cotangent function is carried out in dependence on the determined quadrant, and wherein the result of the division is used as an address for inquiring a stored angle table, the output signal of which represents at least the fine resolution of the position value $\alpha$, said method comprising:

converting the output signals $U_0$, $U_1$ from analog signals into digital signals in analog/digital converters so that all additional calculations are carried out in purely digital fashion;

examining the preceding sign of the digital output signals and forming a cyclic binary code $q_1\ q_0$ thereof, wherein the cyclic binary code determines in which quadrant the position value $\alpha$ lies;

selecting one of said sinusoidal and cosinusoidal output signals as the divisor depending on the determined quadrant in order to prepare an integral division in which the dividend is one of the linear combinations ($U_2$, $U_3$), wherein the amount of the divisor always lies within the range above $\sqrt{2}$ of the maximum value of the respective output signal; and subsequently carrying out the integral division, whereby the result of the integral division represents the address for reading out the angle table.

2. The method according to claim 1, further comprising examining if the amount of the divisor falls short of a predetermined threshold (T2) before the division is carried out, wherein an error message is output depending on the result of this examination.

3. The method according to claim 1, wherein the stored angle table contains the angles of one quadrant and the value ($q_1\ q_0$) that determines the respective quadrant is placed in front of the digital value ($D_{(N-1)} \ldots D_0$) read out of the angle table in order to form the position value $\alpha$.

4. The method according to claim 1, further comprising setting the address for reading out the angle table to the value "0" if the preceding signs of the dividend and the divisor are not identical, and carrying out the division only if the preceding signs of the dividend and the divisor are identical.

5. The method according to claim 1, further comprising examining if the value of the linear combinations ($U_2$, $U_3$) is greater than "0" or less than or equal to "0" in order to determine the quadrant of the linear combinations ($U_2$, $U_3$).

6. The method according to claim 5, further comprising examining whether the linear combination ($U_2$) formed of the sum of both output signals ($U_0$, $U_1$) is greater than "0" or equal to "0," and examining whether the linear combination ($U_3$) formed of the difference between both output signals ($U_0$, $U_1$) is greater than "0."

7. The method according to claim 6, further comprising forming a monotonic cyclic code for the quadrant by linking the inverted value of the examination of the linear combination ($U_2$) formed of the sum of both output signals with the value ($q_1$) of the examination of the linear combination formed of the difference between both output signals ($U_1-U_0$) in EXCLUSIVE OR fashion so as to form a digital signal ($q_0$) representing the bit of least significance of the respective quadrant, whereby the result of the examination of the linear combination formed of the difference between both output signals ($U_1 U_0$) remains the bit of highest significance for determining the respective quadrant.

8. An apparatus for determining the phase angle in position transmitters with sinusoidal output signals, wherein a sinusoidal output signal $U_0(\alpha)=A^*\sin \alpha$ and a cosinusoidal output signal $U_1(\alpha)=A^*\cos \alpha$ are generated by a sensor depending on the position or rotational position a with A being the output signal amplitude, wherein linear combinations $U_2=U_0+U_1$ and $U_3=U_1-U_0$ are formed from the output signals, wherein it is determined in which quadrant the position value $\alpha$ lies by examining the preceding signs of the output signals, wherein a division for forming a tangent function or a cotangent function is carried out in dependence on the determined quadrant, and wherein the result of the division is used as an address for inquiring a stored angle table, the output signal of which represents at least the fine resolution of the position value $\alpha$, said apparatus comprising:

at least one analog/digital converter for converting the analog output signals $U_0$, $U_1$ into digital signals so that all additional calculations may be carried out in purely digital fashion; and a programmed processor adapted for receiving the digitized output signals from said at least one analog/digital converter, said processor being configured for examining the preceding sign of the digitized output signals and forming a cyclic binary code $q_1\ q_0$ thereof, wherein the cyclic binary code determines in which quadrant the position value $\alpha$ lies;

said processor being further configured for selecting one of said sinusoidal and cosinusoidal output signals as the divisor depending on the determined quadrant in order to prepare an integral division in which the dividend is one of the linear combinations ($U_2$, $U_3$), wherein the amount of the divisor always lies within the range above $\sqrt{2}$ of the maximum value of the respective output signal;

wherein said processor is configured to carry out the integral division, whereby the result of the integral division represents the address for reading out the angle table.

9. The apparatus according to claim 8, wherein said processor is configured for examining if the amount of the divisor falls short of a predetermined threshold before the division is carried out, wherein an error message is output depending on the result of this examination.

10. The apparatus according to claim 8, wherein the stored angle table contains the angles of one quadrant, and wherein the value ($q_1\ q_0$) that determines the respective quadrant is placed in front of the digital value ($D_{(N-1)} \ldots D_0$) read out of the angle table in order to form the position value $\alpha$.

11. The apparatus according to claim 8, wherein the address for reading out the angle table is set to the value "0" if the preceding signs of the dividend and the divisor are not identical, and wherein the division is only carried out if the preceding signs of the dividend and the divisor are identical.

12. The apparatus according to claim 8, wherein said processor is further configured for examining if the value of the linear combinations ($U_2$, $U_3$) is greater than "0" in order to determine the quadrant of the linear combinations ($U_2$, $U_3$).

13. The apparatus according to claim 12, wherein said processor is further configured for examining whether the linear combination ($U_2$) formed of the sum of both output signals ($U_0$, $U_1$) is greater than "0," and for examining whether the linear combination ($U_3$) formed of the difference between both output signals ($U_0$, $U_1$) is greater than "0."

14. The apparatus according to claim 13, wherein said processor is further configured for forming a monotonic cyclic code for the quadrant by linking the inverted value of the examination of the linear combination ($U_2$) formed of the sum of both output signals with the value ($q_1$) of the examination of the linear combination formed of the difference between both output signals ($U_1-U_0$) in EXCLUSIVE OR fashion so as to form a digital signal ($q_0$) representing the bit of least significance of the respective quadrant, whereby the result of the examination of the linear combination formed of the difference between both output signals ($U_1-U_0$) remains the bit of highest significance for determining the respective quadrant.

15. An apparatus for determining the phase angle in position transmitters with sinusoidal output signals, wherein a sinusoidal output signal $U_0(\alpha)=A^*\sin \alpha$ and a cosinusoidal output signal $U_1(\alpha)=A^*\cos \alpha$ are generated by a sensor depending on the position or rotational position $\alpha$ with A being the output signal amplitude, wherein an analog/digital converter converts the analog output signals $U_0$, $U_1$ into digital signals so that all additional calculations may be carried out in purely digital fashion, wherein linear combinations $U_2=U_0+U_1$ and $U_3=U_1-U_0$ are formed from the output signals, wherein it is determined in which quadrant the position value $\alpha$ lies by examining the preceding signs of the output signals, wherein a division for forming a tangent function or a cotangent function is carried out in dependence on the determined quadrant, and wherein the result of the division is used as an address for inquiring a stored angle table, the output signal of which represents at least the fine resolution of the position value $\alpha$, said apparatus comprising:

a processor;

said processor being programmed to execute the following steps:

receiving the digitized output signals from the analog/digital converter;

examining the preceding sign of the digitized output signals and forming a cyclic binary code $q_1\ q_0$ thereof, wherein the cyclic binary code determines in which quadrant the position value $\alpha$ lies;

selecting one of said sinusoidal and cosinusoidal output signals as the divisor depending on the determined quadrant in order to prepare an integral division in which the dividend is one of the linear combinations ($U_2$, $U_3$), wherein the amount of the divisor always lies within the range above $\sqrt{2}$ of the maximum value of the respective output signal; and carrying out the integral division, whereby the result of the integral division represents the address for reading out the angle table.

16. The apparatus according to claim 15, said processor being programmed for examining if the amount of the divisor falls short of a predetermined threshold before the division is carried out, wherein an error message is output depending on the result of this examination.

17. The apparatus according to claim 15, wherein the stored angle table contains the angles of one quadrant, and wherein the value ($q_1\ q_0$) that determines the respective quadrant is placed in front of the digital value ($D_{(N-1)} \ldots D_0$) read out of the angle table in order to form the position value $\alpha$.

18. The apparatus according to claim 15, wherein the address for reading out the angle table is set to the value "0" if the preceding signs of the dividend and the divisor are not identical, and wherein the division is only carried out if the preceding signs of the dividend and the divisor are identical.

19. The apparatus according to claim 15, said processor being programmed for examining if the value of the linear combinations ($U_2$, $U_3$) is greater than "0" in order to determine the quadrant of the linear combinations ($U_2$, $U_3$).

20. The apparatus according to claim 19, said processor being programmed for examining whether the linear combination ($U_2$) formed of the sum of both output signals ($U_0$, $U_1$) is greater than "0," and for examining whether the linear combination ($U_3$) formed of the difference between both output signals ($U_0$, $U_1$) is greater than "0."

21. The apparatus according to claim 20, said processor being programmed for forming a monotonic cyclic code for the quadrant by linking the inverted value of the examination of the linear combination ($U_2$) formed of the sum of both output signals with the value ($q_1$) of the examination of the linear combination formed of the difference between both output signals ($U_1-U_0$) in EXCLUSIVE OR fashion so as to form a digital signal ($q_0$) representing the bit of least significance of the respective quadrant, whereby the result of the examination of the linear combination formed of the difference between both output signals ($U_1-U_0$) remains the bit of highest significance for determining the respective quadrant.

* * * * *